US012716778B2

(12) United States Patent
Oh et al.

(10) Patent No.: US 12,716,778 B2
(45) Date of Patent: Aug. 25, 2026

(54) DEVICE FOR VISUALIZING TEMPERATURE AND AMOUNT OF STATIC ELECTRICITY

(71) Applicant: SEMES CO., LTD., Chungcheongnam-do (KR)

(72) Inventors: Junho Oh, Hwaseong-si (KR); Jaehong Kim, Asan-si (KR); Kwangsup Kim, Asan-si (KR); Jongmin Lee, Yonhin-si (KR); Yeonchul Song, Seoul-si (KR); Youngho Park, Incheon-si (KR); Jihoon Yoo, Hwaseong-si (KR); Myeongjun Lim, Hwaseong-si (KR); Sanghyun Son, Busan-si (KR); Joongchol Shin, Hwaseong-si (KR)

(73) Assignee: SEMES CO., LTD., Chungcheongnam-do (KR)

( * ) Notice: Subject to any disclaimer, the term of this patent is extended or adjusted under 35 U.S.C. 154(b) by 352 days.

(21) Appl. No.: 18/513,655

(22) Filed: Nov. 20, 2023

(65) Prior Publication Data

US 2024/0167881 A1 May 23, 2024

(30) Foreign Application Priority Data

Nov. 22, 2022 (KR) ........................ 10-2022-0157508

(51) Int. Cl.

| | |
|---|---|
| ***G01J 5/08*** | (2022.01) |
| ***G01R 29/12*** | (2006.01) |
| *G01J 5/00* | (2022.01) |

(52) U.S. Cl.

CPC ............ *G01J 5/0859* (2013.01); *G01R 29/12* (2013.01); *G01J 2005/0077* (2013.01)

(58) Field of Classification Search

None

See application file for complete search history.

(56) References Cited

U.S. PATENT DOCUMENTS

2003/0148620 A1* 8/2003 Chavan .................... G01J 5/12 257/E27.008

2014/0375652 A1* 12/2014 Jeon ...................... G06T 11/206 345/440

(Continued)

FOREIGN PATENT DOCUMENTS

| | | |
|---|---|---|
| CN | 212255465 | 12/2020 |
| KR | 10-2013-0089122 | 8/2013 |

(Continued)

OTHER PUBLICATIONS

Notice of Allowance dated Nov. 27, 2025 for Korean Application No. 10-2022-0157508 and its English translation from Global Dossier.

*Primary Examiner* — Erica S Lin

(74) *Attorney, Agent, or Firm* — WOMBLE BOND DICKINSON (US) LLP

(57) ABSTRACT

Provided is a device for visualizing a temperature and an amount of static electricity, wherein the device is arranged adjacent to a substrate processing liquid providing unit including a pipe to provide a passage through which a substrate processing liquid is transferred and a processing liquid storage module for storing the substrate processing liquid, the device including a photographing unit configured to generate a plurality of partially captured images by photographing a plurality of areas of a measurement target, a static electricity sensor configured to measure static electricity levels of the plurality of areas of the measurement target, a thermal imaging camera configured to measure temperatures of the plurality of areas of the measurement target, a processor configured to generate an entire image by (Continued)

combining the plurality of partially captured images with each other, and an output unit configured to output a visualization image.

20 Claims, 11 Drawing Sheets

(56) References Cited

U.S. PATENT DOCUMENTS

| | | | | |
|---|---|---|---|---|
| 2016/0343118 | A1* | 11/2016 | Olsen | G06T 5/92 |
| 2021/0285822 | A1* | 9/2021 | Carcasi | H04N 23/23 |

FOREIGN PATENT DOCUMENTS

| | | |
|---|---|---|
| KR | 10-2015-0000544 | 1/2015 |
| KR | 10-2017-0009539 | 1/2017 |
| KR | 10-1793919 | 11/2017 |
| KR | 10-1883933 | 8/2018 |
| KR | 10-2270937 | 7/2021 |
| KR | 10-2312521 | 10/2021 |
| KR | 10-2325577 | 11/2021 |
| KR | 10-2386221 | 4/2022 |
| KR | 10-2022-0097611 | 7/2022 |

* cited by examiner 110
50
560
510
120
230
231
232
233
220
221
222
223
210
211
212
213
214
215
W
241
242
240
244
250
224
225
226
227
228
229
z
y
x

DEVICE FOR VISUALIZING TEMPERATURE AND AMOUNT OF STATIC ELECTRICITY

CROSS-REFERENCE TO RELATED APPLICATION

This application is based on and claims priority under 35 U.S.C. § 119 to Korean Patent Application No. 10-2022-0157508, filed on Nov. 22, 2022, in the Korean Intellectual Property Office, the disclosure of which is incorporated by reference herein in its entirety.

BACKGROUND

1. Field

The disclosure relates to a device and method for visualizing a temperature and an amount of static electricity, and more particularly, to measuring an amount of static electricity and a temperature by using a stereo camera, a thermal imaging camera, and a color camera.

2. Description of the Related Art

Static electricity is generated in a processing liquid storage module in which a substrate processing liquid is stored, a pipe, or a substrate cleaning device in which the substrate processing liquid is used, and acts as a critical error in a specific process. Thus, accurate measurement of the amount of static electricity generated and a position where the static electricity is generated is required.

In addition, when it is possible to predict the temperature of the substrate processing liquid stored in the processing liquid storage module, the surface temperature of a processing liquid heating module may be adjusted based on the predicted temperature, and a time period required for the processing liquid heating module to cause the substrate processing liquid to reach a desired temperature may be reduced. Therefore, accurate measurement of the temperature of the substrate processing liquid is required.

Accordingly, there is a need for an efficient and accurate measuring device capable of simultaneously measuring the amount of static electricity generated in and the temperature of a processing liquid storage module in which a substrate processing liquid is stored, a pipe, or a cleaning device in which the substrate processing liquid is used.

SUMMARY

Provided is a device for visualizing a temperature and an amount of static electricity by simultaneously and more accurately measuring an amount of static electricity and a temperature.

The objectives of the disclosure are not limited to the foregoing, and other unmentioned objectives would be clearly understood by those skill in the art from the following description.

Additional aspects will be set forth in part in the description which follows and, in part, will be apparent from the description, or may be learned by practice of the presented embodiments of the disclosure.

According to an aspect of the disclosure, provided is a device for visualizing a temperature and an amount of static electricity, wherein the device is arranged adjacent to a substrate processing liquid providing unit comprising a pipe providing a passage through which a substrate processing liquid is transferred and a processing liquid storage module for storing the substrate processing liquid, the device including a photographing unit configured to generate a plurality of partially captured images by photographing a plurality of areas of a measurement target, a static electricity sensor configured to measure static electricity levels of the plurality of areas of the measurement target, a thermal imaging camera configured to measure temperatures of the plurality of areas of the measurement target, a processor configured to generate an entire image by combining the plurality of partially captured images with each other, and an output unit configured to output a visualization image in which temperature levels measured by the thermal imaging camera and the static electricity levels measured by the static electricity sensor are visualized on the entire image.

According to an embodiment, the visualization image includes colors respectively corresponding to the temperature levels and the static electricity levels of the measurement target measured by the thermal imaging camera and the static electricity sensor, in the entire image generated by combining the plurality of partially captured images with each other.

According to an embodiment, the device further includes a distance sensor configured to measure a distance between the measurement target and the static electricity sensor, wherein the static electricity sensor is further configured to, in response to the distance between the measurement target and the static electricity sensor being less than or equal to a threshold value, send data regarding the measured static electricity levels to the processor.

According to an embodiment, the device further includes an integrated sensor including the photographing unit, the static electricity sensor, the thermal imaging camera, the output unit, and the distance sensor, wherein the processor is further configured to control the integrated sensor.

According to an embodiment, the measurement target is an exterior of a substrate seated on a substrate cleaning device, an exterior of the pipe, or an exterior of the processing liquid storage module.

According to an embodiment, the processor includes an image processing unit configured to preprocess the plurality of partially captured images.

According to an embodiment, the processor is further configured to generate the entire image by combining the plurality of partially captured images with each other by using a stitching algorithm.

According to an embodiment, the processor is further configured to receive the plurality of partially captured images from the photographing unit, receive data regarding the temperature levels measured by the thermal imaging camera and the static electricity levels measured by the static electricity sensor, and generate the visualization image in which colors respectively corresponding to the static electricity levels measured by the static electricity sensor and the temperature levels measured by the thermal imaging camera are indicated in the entire image generated by combining the plurality of partially captured images with each other.

According to an embodiment, the device further includes a memory for storing color data corresponding to the static electricity levels measured by the static electricity sensor and the temperature levels measured by the thermal imaging camera, wherein the processor is further configured to generate the visualization image by using the color data stored in the memory.

According to an embodiment, the output unit is further configured to output the static electricity levels of the measurement target measured by the static electricity sensor and the temperature levels of the measurement target measured by the thermal imaging camera, as numerical values.

According to another aspect of the disclosure, provided is a device for visualizing a temperature and an amount of static electricity, wherein the device is arranged adjacent to a substrate processing liquid providing unit comprising a pipe providing a passage through which a substrate processing liquid is transferred and a processing liquid storage module for storing the substrate processing liquid, the device including a photographing unit configured to generate a plurality of partially captured images by photographing a plurality of areas of a measurement target in a plurality of modes, a static electricity sensor configured to measure static electricity levels of the plurality of areas of the measurement target, a thermal imaging camera configured to measure temperature levels of the plurality of areas of the measurement target, an integrated sensor including an output unit configured to output a visualization image in which the static electricity levels measured by the static electricity sensor and the temperature levels measured by the thermal imaging camera are visualized on the plurality of partially captured images, and a processor configured to control the integrated sensor and generate an entire image by combining the plurality of partially captured images with each other, wherein the visualization image includes colors respectively corresponding the static electricity levels of the measurement target measured by the static electricity sensor and the temperature levels of the measurement target measured by the thermal imaging camera, on the entire image.

According to an embodiment, the integrated sensor further includes a distance sensor configured to measure a distance between the measurement target and the static electricity sensor.

According to an embodiment, the static electricity sensor is further configured to, in response to the distance between the measurement target and the static electricity sensor measured by the distance sensor being less than or equal to a threshold value, provide data regarding the static electricity levels to the processor.

According to an embodiment, the processor is further configured to generate the entire image by combining the plurality of partially captured images with each other by using a stitching algorithm.

According to an embodiment, the measurement target is an exterior of a substrate seated on a substrate cleaning device, an exterior of the pipe, or an exterior of the processing liquid storage module.

According to an embodiment, the processor is further configured to receive the plurality of partially captured images from the photographing unit, receive data regarding the static electricity levels measured by the static electricity sensor and data regarding the temperature levels measured by the thermal imaging camera, generate the visualization image in which colors respectively corresponding to the static electricity levels measured by the static electricity sensor and the temperature levels measured by the thermal imaging camera are indicated on the plurality of partially captured images, and provide the visualization image to the output unit.

According to an embodiment, the device further includes a memory for storing color data corresponding to the static electricity levels measured by the static electricity sensor and the temperature levels measured by the thermal imaging camera, wherein the processor is further configured to generate the visualization image by using the color data stored in the memory.

According to an embodiment, the static electricity sensor is further configured to, when the photographing unit generates the plurality of partially captured images, measure a static electricity level of the measurement target, and the thermal imaging camera is further configured to, when the photographing unit generates the plurality of partially captured images, measure a temperature level of the measurement target.

According to another aspect of the disclosure, provided is a device for visualizing a temperature and an amount of static electricity, wherein the device is arranged adjacent to a substrate processing liquid providing unit comprising a pipe providing a passage through which a substrate processing liquid is transferred and a processing liquid storage module for storing the substrate processing liquid, the device including a photographing unit configured to generate a plurality of partially captured images by photographing a plurality of areas of a measurement target, a static electricity sensor configured to measure static electricity levels of the plurality of areas of the measurement target, a thermal imaging camera configured to measure temperatures of the plurality of areas of the measurement target, a processor configured to generate an entire image by combining the plurality of partially captured images with each other, an output unit configured to output a visualization image in which temperature levels measured by the thermal imaging camera and the static electricity levels measured by the static electricity sensor are visualized on the entire image, a distance sensor configured to measure a distance between the measurement target and the static electricity sensor, an integrated sensor including the photographing unit, the static electricity sensor, the thermal imaging camera, the output unit, and the distance sensor, and an image processing unit configured to preprocess the plurality of partially captured images, wherein the visualization image includes colors respectively corresponding to the temperature levels and the static electricity levels of the measurement target measured by the thermal imaging camera and the static electricity sensor, in the entire image generated by combining the plurality of partially captured images with each other, the static electricity sensor is further configured to, in response to the distance between the measurement target and the static electricity sensor being less than or equal to a threshold value, send data regarding the measured static electricity levels to the processor, the processor is further configured to control the integrated sensor and generate the entire image by combining the plurality of partially captured images with each other by using a stitching algorithm, and the measurement target is an exterior of a substrate seated on a substrate cleaning device, an exterior of the pipe, or an exterior of the processing liquid storage module.

According to an embodiment, the device further includes a memory for storing color data corresponding to the static electricity levels measured by the static electricity sensor and the temperature levels measured by the thermal imaging camera, wherein the processor is further configured to generate the visualization image by using the color data stored in the memory, receive the plurality of partially captured images from the photographing unit, receive data regarding the temperature levels measured by the thermal imaging camera and the static electricity levels measured by the static electricity sensor, and generate the visualization image in which colors respectively corresponding to the static electricity levels measured by the static electricity sensor and the temperature levels measured by the thermal imaging camera are indicated in the entire image generated by combining the plurality of partially captured images with each other.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
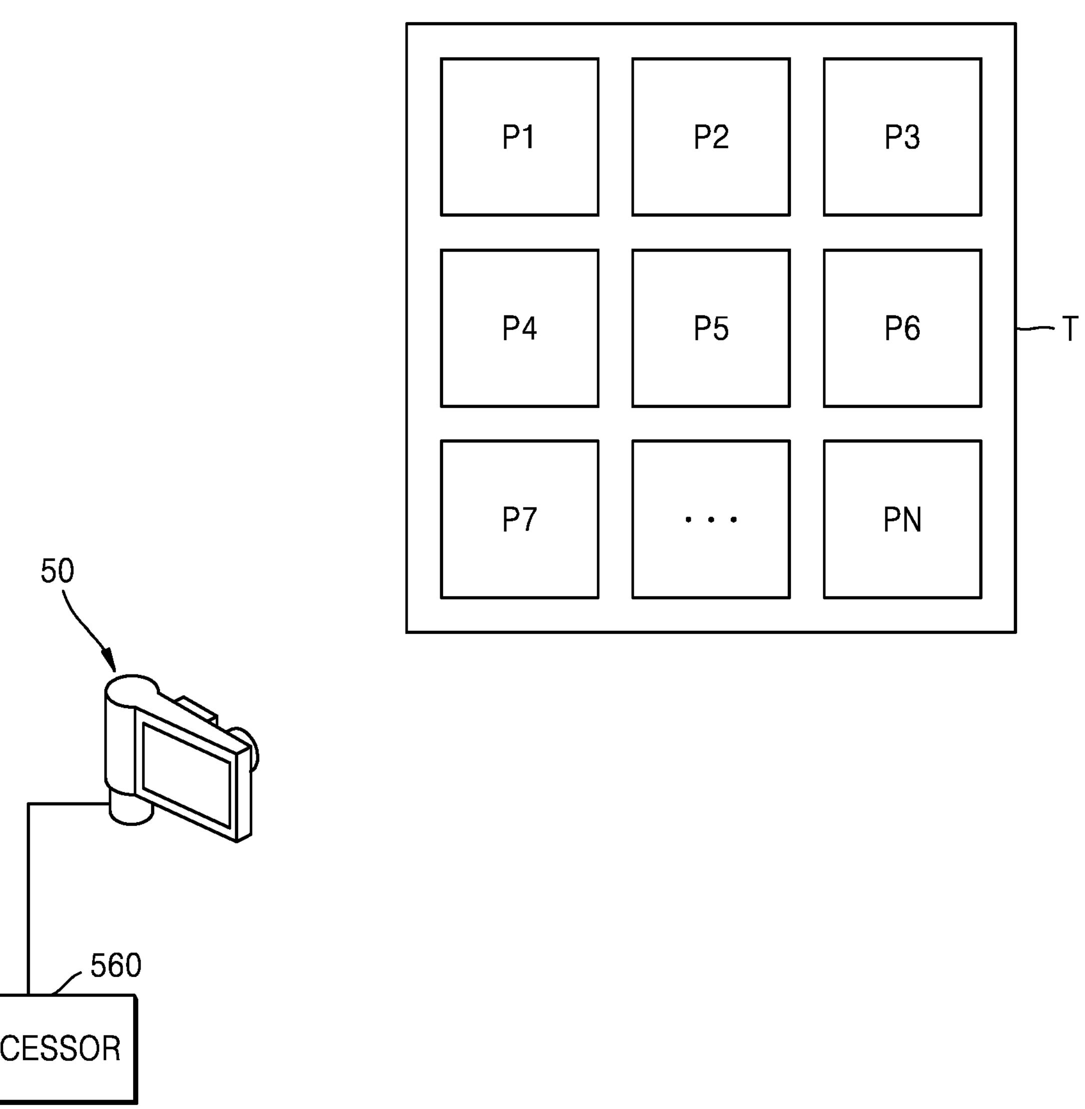
FIG. 1 is a diagram for describing a device for visualizing a temperature and static electricity, according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description.

Hereinafter, embodiments will be described in detail with reference to the accompanying drawings. However, the disclosure should not be configured as limited to the embodiments described below, and may be embodied in various other forms. The following embodiments are provided to sufficiently convey the scope of the disclosure to those skill in the art rather than to make the disclosure to be wholly completed.

Figure 2:
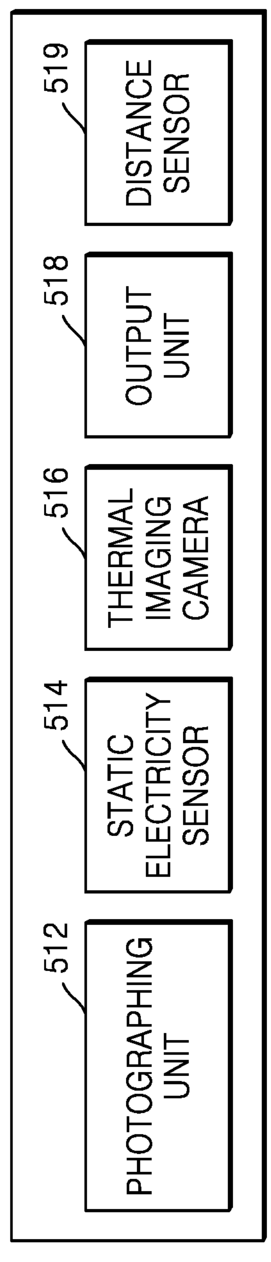
FIG. 2 is a diagram for describing an integrated sensor of a device for visualizing a temperature and static electricity, according to an embodiment.

FIG. 1 is a diagram for describing a device 50 for visualizing a temperature and static electricity, according to an embodiment. FIG. 2 is a diagram for describing an integrated sensor 510 of the device 50 for visualizing a temperature and static electricity, according to an embodiment. Referring to FIGS. 1 and 2, the device 50 for visualizing a temperature and static electricity according to an embodiment includes the integrated sensor 510 and a processor 560.

The integrated sensor 510 may photograph a measurement target T and measure a temperature and static electricity of the measurement target T. In addition, the integrated sensor 510 may output an image that visually represents a temperature level and a static electricity level of the measurement target T. The integrated sensor 510 may be portable and may measure temperature levels and static electricity levels at a plurality of positions on the measurement target T.

A photographing unit 512 may photograph the measurement target T. The photographing unit 512 may transmit an image obtained by photographing the measurement target T to the processor 560.

The photographing unit 512 may photograph a first area P1 of the measurement target T in a first mode. In detail, the photographing unit 512 may photograph the first area P1 of the measurement target T at a first distance from the measurement target T in the first mode. The photographing unit 512 may generate a first captured image including the first area P1 of the measurement target T in the first mode.

The photographing unit 512 may photograph a second area P2 of the measurement target T in a second mode. In detail, the photographing unit 512 may photograph the second area P2 of the measurement target T at a second distance from the measurement target T in the second mode. The photographing unit 512 may generate a second captured image including the second area P2 of the measurement target T in the second mode. As such, the photographing unit 512 may repeatedly photograph the measurement target T to photograph an N-th area PN of the measurement target T at an N-th distance.

A static electricity sensor 514 may measure a static electricity level of the measurement target T. The static electricity sensor 514 may measure a static electricity level detected at a position on the surface of the measurement target T at which the static electricity sensor 514 is installed.

When the photographing unit 512 captures a partial image of the measurement target T, the static electricity sensor 514 may measure a static electricity level of the measurement target T. In detail, when the integrated sensor 510 is aligned with a particular position on the measurement target T such that the photographing unit 512 captures a partial image of the measurement target T, the static electricity sensor 514 may measure a static electricity level detected at the particular position. That is, when the integrated sensor 510 is aligned at the particular position such that the static electricity sensor 514 measures the static electricity level detected at the particular position on the measurement target T, the photographing unit 512 may photograph the particular position. At this time, the photographing unit 512 may generate an N-th captured image including an image of the particular position. When the integrated sensor 510 is aligned with the particular position on the measurement target T and the photographing unit 512 generates the N-th captured image including the partial image of the measurement target T, the static electricity sensor 514 may measure the static electricity level at the particular position on the measurement target T.

The static electricity sensor 514 may provide the processor 560 with the static electricity level measured at the particular position on the measurement target T at which the integrated sensor 510 is aligned. In detail, when the distance between the integrated sensor 510 and the measurement target T measured by a distance sensor 519 is less than or equal to a threshold value, the static electricity sensor 514 may provide the measured static electricity level to the processor 560.

A thermal imaging camera 516 may measure a temperature level of the measurement target T. The thermal imaging camera 516 may measure a temperature level detected at a position on the surface of the measurement target T at which the thermal imaging camera 516 is installed.

When the photographing unit 512 captures a partial image of the measurement target T, the thermal imaging camera 516 may measure a temperature level of the measurement target T. In detail, when the integrated sensor 510 is aligned with a particular position on the measurement target T such that the photographing unit 512 captures a partial image of the measurement target T, the thermal imaging camera 516 may measure a temperature level detected at the particular position. That is, when the integrated sensor 510 is aligned at the particular position such that the thermal imaging camera 516 measures the temperature level detected at the particular position on the measurement target T, the photographing unit 512 may photograph the particular position. At this time, the photographing unit 512 may generate an N-th captured image including an image of the particular position. When the integrated sensor 510 is aligned with the particular position on the measurement target T and the photographing unit 512 generates the N-th captured image including the partial image of the measurement target T, the thermal imaging camera 516 may measure the temperature level at the particular position on the measurement target T. At this time, the thermal imaging camera 516 may measure temperatures of a plurality of areas.

The thermal imaging camera 516 may provide the processor 560 with the temperature level measured at the particular position on the measurement target T at which the integrated sensor 510 is aligned. In detail, when the distance between the integrated sensor 510 and the measurement target T measured by a distance sensor 519 is less than or equal to a threshold value, the thermal imaging camera 516 may provide the measured temperature level to the processor 560.

The output unit 518 may output N captured images including partial images of the measurement target T generated by the photographing unit 512 in the first mode to an N-th mode.

The output unit 518 may output a visualization image provided from the processor 560. An output unit 518 may output a visualization image that visually represents a temperature level and a static electricity level measured at a position matched with the N-th image captured by the photographing unit 512 in the N-th mode. In detail, the output unit 518 may output a visualization image in which, at a particular position on the measurement target T photographed by the photographing unit 512 in the N-th mode, colors corresponding to the temperature level and the static electricity level measured at the particular position are indicated.

The distance sensor 519 may measure the distance between the integrated sensor 510 and the measurement target T. In detail, when the photographing unit 512 photographs a particular position on the measurement target T in the N-th mode to generates an N-th captured image including a partial image of the measurement target T, the distance sensor 519 may measure the distance between the integrated sensor 510 and the measurement target T. That is, when the static electricity sensor 514 and the thermal imaging camera 516 respectively measure a static electricity level and a temperature level detected at a particular position on the measurement target T, the distance sensor 519 may measure the distance between the integrated sensor 510 and the measurement target T. The distance sensor 519 may provide the measured distance between the integrated sensor 510 and the measurement target T to the processor 560.

The processor 560 may generate a visualization image that visually represents the static electricity level measured by the static electricity sensor 514 and the temperature level measured by the thermal imaging camera 516.

The processor 560 may receive data regarding the static electricity level measured by the static electricity sensor 514 and the temperature level measured by the thermal imaging camera 516, from the static electricity sensor 514 and the thermal imaging camera 516, respectively. In detail, when the distance between the integrated sensor 510 and the measurement target T measured by the distance sensor 519 is less than or equal to a threshold value, the processor 560 may receive the data regarding the measured static electricity level and temperature level, from the static electricity sensor 514 and the thermal imaging camera 516, respectively. When the static electricity sensor 514 is aligned at a distance less than or equal to the threshold value, from the measurement target T, and measures a static electricity level, the processor 560 may generate a visualization image by using a static electricity level and a temperature level detected at a particular position on the measurement target T. That is, when the static electricity sensor 514 and the thermal imaging camera 516 respectively measure a static electricity level and a temperature level both detected at the measurement target T at a distance less than or equal to the threshold value, the processor 560 may determine that data regarding the static electricity level and the temperature level respectively measured by the static electricity sensor 514 and the thermal imaging camera 516 is reliable, and generate a visualization image.

The processor 560 may receive, from the photographing unit 512, an image obtained by the photographing unit 512 photographing the measurement target T. In detail, the processor 560 may receive a captured image for a partial image of the measurement target T captured by the photographing unit 512 in the N-th mode.

The processor 560 may generate an entire image by combining N-th captured images including partial images of the measurement target T provided from the photographing unit 512. In detail, the processor 560 may generate an entire image of the measurement target T by combining N partial images of the measurement target T by using a stitching algorithm.

The processor 560 may set the mode of the output unit 518. For example, the processor 560 may control the output unit 518 to switch between a first mode for outputting a first captured image including an image of the first area P1 of the measurement target T, and a second mode for outputting a second captured image including an image of the second area P2 of the measurement target T.

The processor 560 may determine colors indicated in a visualization image by using a static electricity level and a temperature level provided from the static electricity sensor 514 and the thermal imaging camera 516, respectively. In detail, the processor 560 may generate a visualization image by determining a color corresponding to a static electricity level measured by the static electricity sensor 514 and the thermal imaging camera 516, and indicating the determined color in a captured image provided by the photographing unit 512. This will be described in detail below with reference to FIGS. 3 to 5.

Figure 3:
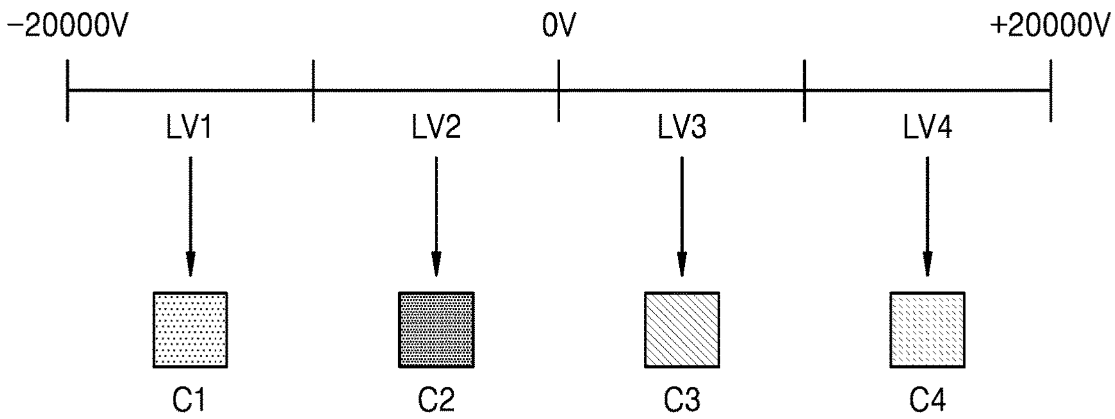
FIGS. 3 to 5 are diagrams for describing a device for visualizing a temperature and static electricity, according to an embodiment.
Figure 4:
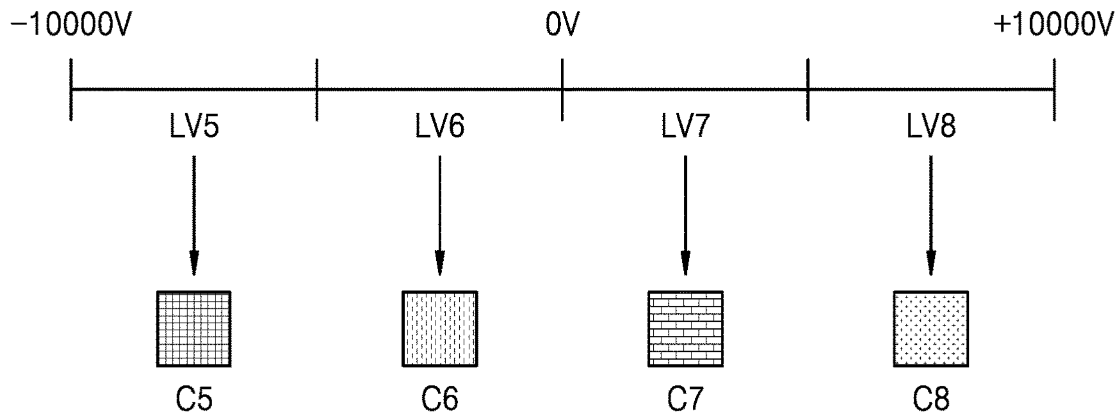
Figure 5:
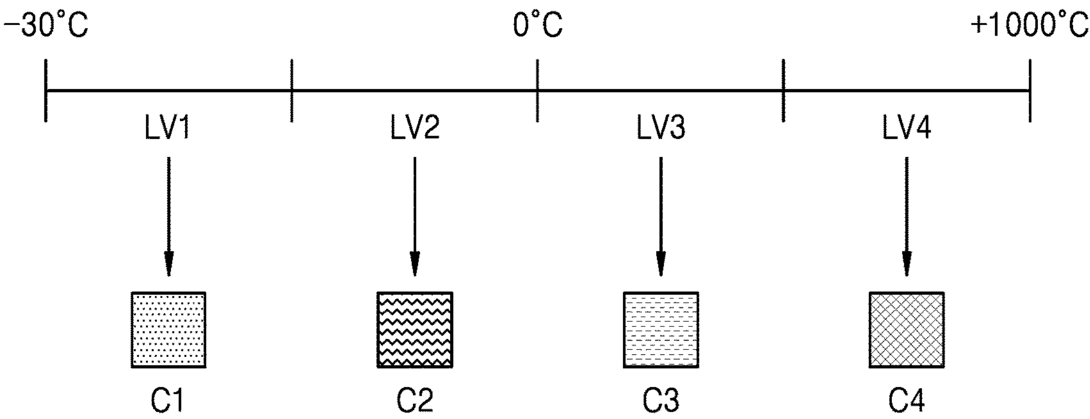

FIGS. 3 to 5 are diagrams for describing a device for visualizing a temperature and static electricity, according to an embodiment.

Referring to FIGS. 3 to 5, a color chart may include colors corresponding to static electricity levels and temperature levels measured by the static electricity sensor 514 and the thermal imaging camera 516, respectively. That is, the processor 560 may determine colors corresponding to a static electricity level and a temperature level provided from the static electricity sensor 514 and the thermal imaging camera 516, respectively, according to the color chart, and indicate the determined colors in a visualization image output by the output unit 518.

For example, referring to FIG. 3, in a case where the total range of static electricity levels measured by the static electricity sensor 514 is −20000 V to +20000 V and is divided into four level sections, the static electricity levels may be matched with colors by using a first color chart.

Thus, when the processor 560 determines a color to be included in a visualization image according to the first color chart, and a static electricity level measured by the static electricity sensor 514 corresponds to a first level LV1 of the first color chart, the processor 560 may indicate a first color C1 in a captured image provided by the photographing unit 512. When a static electricity level measured by the static electricity sensor 514 corresponds to a second level LV2 of the first color chart, the processor 560 may indicate a second color C2 in a captured image provided by the photographing unit 512.

Similarly, when static electricity levels measured by the static electricity sensor 514 at different positions correspond to a third level LV3 and a fourth level LV4 of the first color chart, the processor 560 may indicate a third color C3 and a fourth color C4 in captured images provided by the photographing unit 512, respectively.

As another example, referring to FIG. 4, in a case where the total range of static electricity levels measured by the static electricity sensor 514 is −10000 V to +10000 V and is divided into four level sections, the static electricity levels may be matched with colors by using a second color chart.

Thus, when the processor 560 determines a color to be included in a visualization image according to the second color chart, and a static electricity level measured by the static electricity sensor 514 corresponds to a fifth level LV5 of the second color chart, the processor 560 may indicate a fifth color C5 in a captured image provided by the photographing unit 512. When a static electricity level measured by the static electricity sensor 514 corresponds to a sixth level LV6 of the second color chart, the processor 560 may indicate a sixth color C6 in a captured image provided by the photographing unit 512.

Similarly, when static electricity levels measured by the static electricity sensor 514 at different positions correspond to a seventh level LV7 and an eighth level LV8 of the second color chart, the processor 560 may indicate a seventh color C7 and an eighth color C8 in captured images provided by the photographing unit 512, respectively.

Referring to FIG. 5, in a case where the total range of temperature levels measured by the thermal imaging camera 516 is −30° C. to +1000° C. and is divided into four level sections, the temperature electricity levels may be matched with colors by using a third color chart.

Thus, when the processor 560 determines a color to be included in a visualization image according to the third color chart, and a temperature level measured by the thermal imaging camera 516 corresponds to a first level LV1 of the third color chart, the processor 560 may indicate a first color C1 in a captured image provided by the photographing unit 512. When a temperature level measured by the thermal imaging camera 516 corresponds to a second level LV2 of the third color chart, the processor 560 may indicate a second color C2 in a captured image provided by the photographing unit 512.

Similarly, when temperature levels measured by the thermal imaging camera 516 at different positions correspond to a third level LV3 and a fourth level LV4 of the third color chart, the processor 560 may indicate a third color C3 and a fourth color C4 in captured images provided by the photographing unit 512, respectively.

FIGS. 3 to 5 illustrate examples in which the total range of static electricity levels and the total range of temperature levels respectively measured by the static electricity sensor 514 and the thermal imaging camera 516 are divided into four level sections, but the embodiments are limited thereto. Depending on the total range of static electricity levels and the total range of temperature levels respectively measured by the static electricity sensor 514 and the thermal imaging camera 516, the numbers of sections for dividing the total range of static electricity levels and the total range of temperature levels may vary according to an embodiment.

As the number of sections for dividing the total range of static electricity levels increases, the number of colors corresponding to respective sections increases, and thus, the distribution of static electricity levels may be confirmed in detail through a visualization image.

Figure 6:
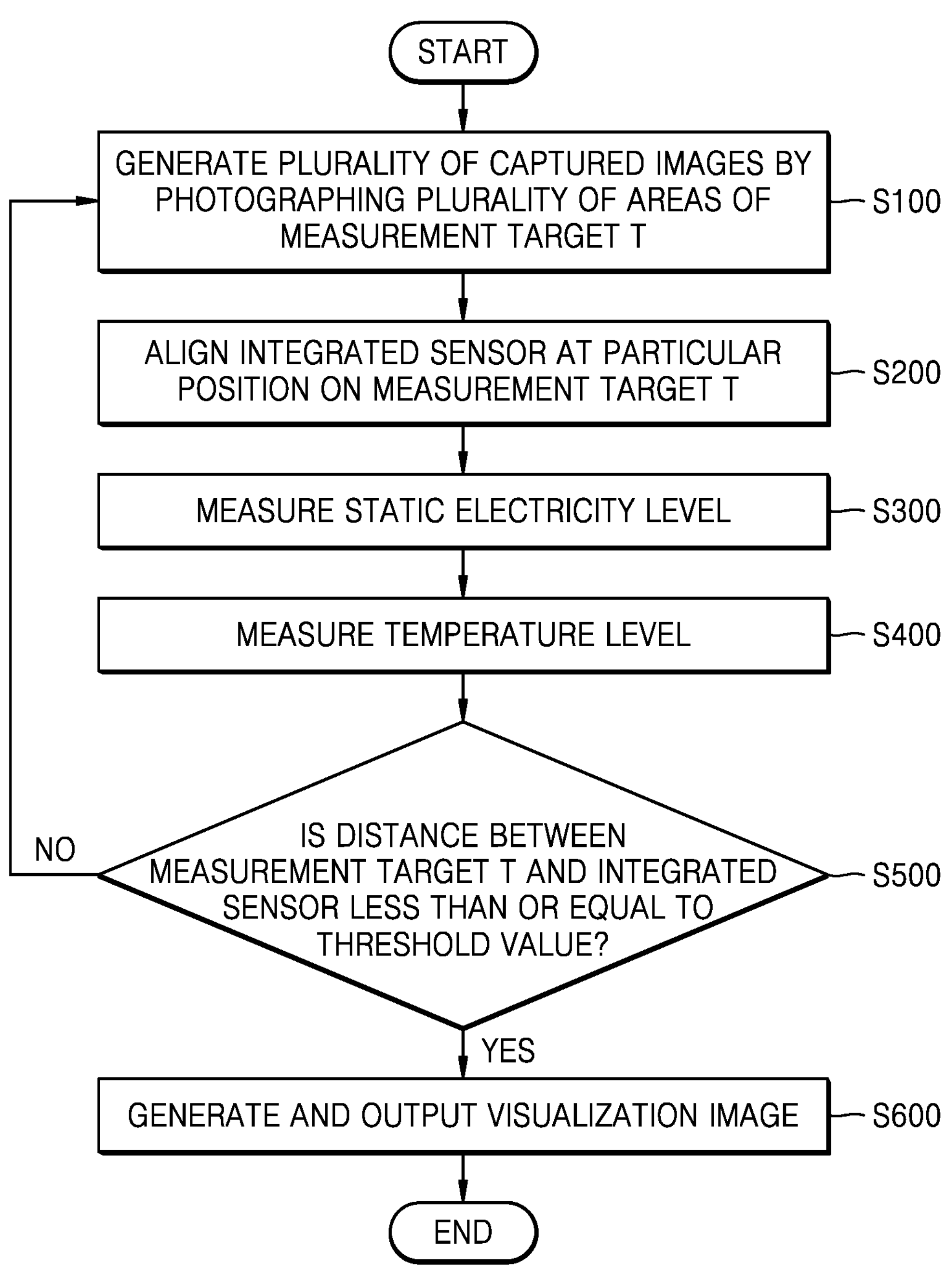
FIG. 6 is a flowchart for describing operations of a device for visualizing a temperature and static electricity, according to an embodiment.
Figure 7:
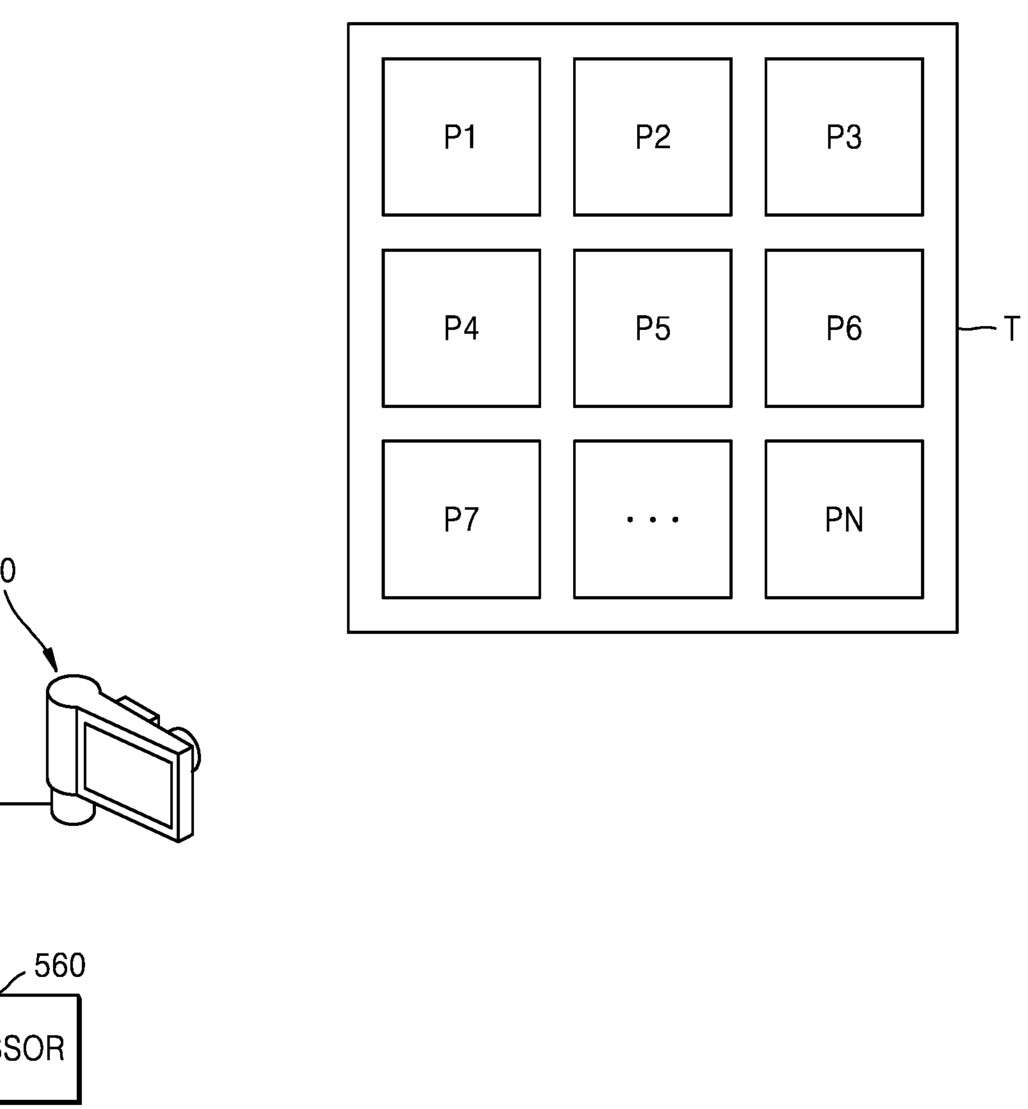
FIGS. 7 and 8 are diagrams for describing operations of a device for visualizing a temperature and static electricity, according to an embodiment.
Figure 8:
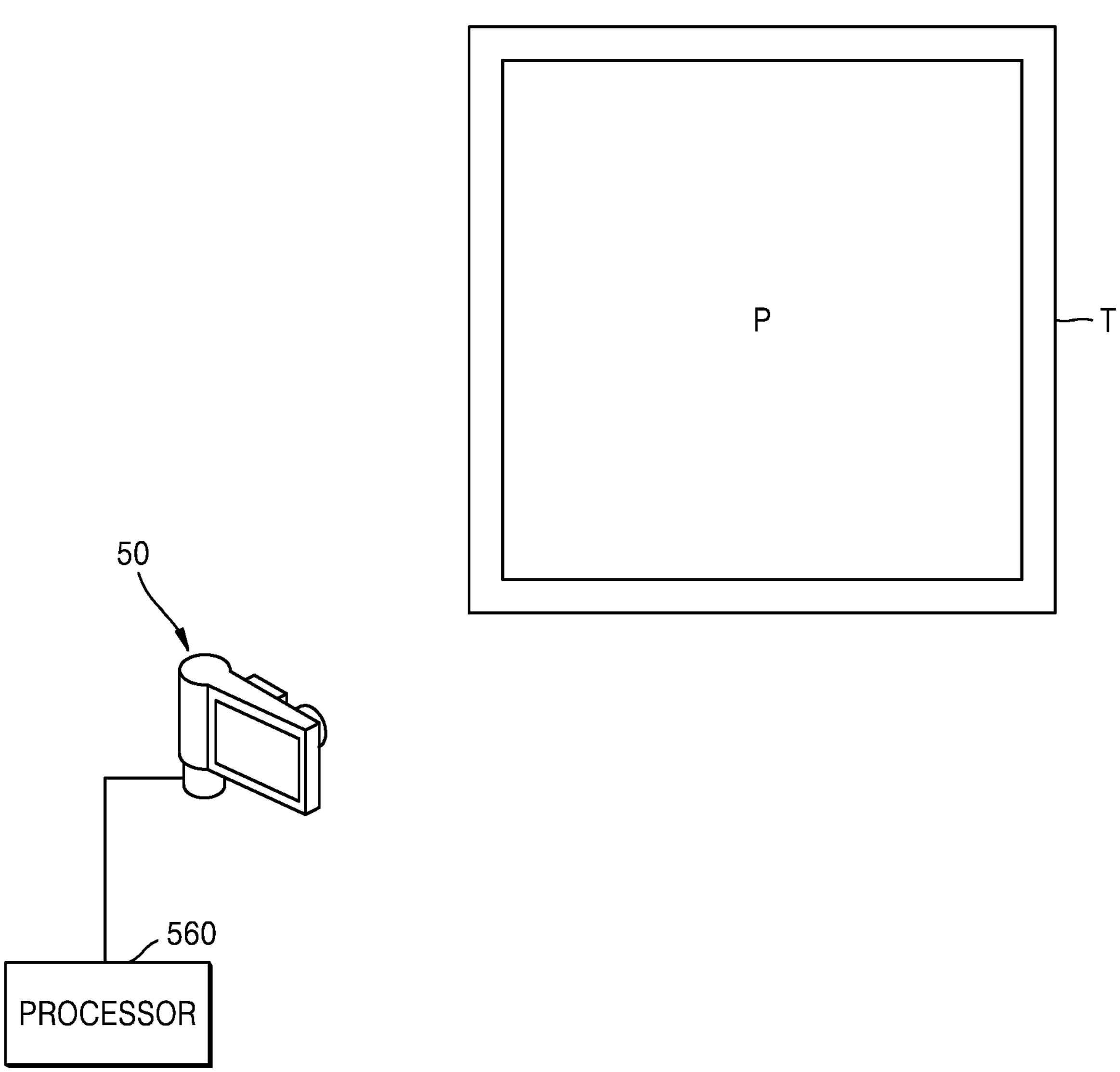

FIG. 6 is a flowchart for describing operations of a device for visualizing a temperature and static electricity, according to an embodiment. FIGS. 7 and 8 are diagrams for describing operations of a device for visualizing a temperature and static electricity, according to an embodiment.

Referring to FIGS. 1, 2, and 6, the photographing unit 512 generates a plurality of partially captured images by photographing a plurality of areas of the measurement target T (S100). In detail, the integrated sensor 510 may be installed at a first distance from the measurement target T, and capture a partial image of the measurement target T.

Referring to FIGS. 6 and 7, the integrated sensor 510 is aligned at a particular position on the measurement target T (S200). In detail, the integrated sensor 510 may be installed at a second distance from the measurement target T. At this time, the second distance may be less than a first distance.

Referring again to FIGS. 2 and 6, the static electricity sensor 514 measures a static electricity level of the measurement target T (S300). In detail, the static electricity sensor 514 may measure a static electricity level of the measurement target T at a certain distance from the measurement target T at which the integrated sensor 510 is installed. That is, the static electricity sensor 514 may measure a static electricity level detected at a particular position on the measurement target T at which the integrated sensor 510 is aligned.

Next, the thermal imaging camera 516 measures a temperature level of the measurement target T (S400). In detail, the thermal imaging camera 516 may measure a temperature level of the measurement target T at a certain distance from the measurement target T at which the integrated sensor 510 is installed. That is, the thermal imaging camera 516 may measure a temperature level detected at a particular position on the measurement target T at which the integrated sensor 510 is aligned.

Next, the device 50 for visualizing a temperature and static electricity determines whether the distance between the measurement target T and the integrated sensor 510 is less than or equal to a threshold value (S500).

Referring to FIGS. 1, 2, and 6, when the distance between the measurement target T and the integrated sensor 510 is less than or equal to the threshold value, the device 50 for visualizing a temperature and static electricity generates and outputs a visualization image (S600). In detail, when the distance between the measurement target T and the integrated sensor 510 measured by the distance sensor 519 is less than or equal to the threshold value, the processor 560 may generate a visualization image by indicating colors corresponding to a static electricity level and a temperature level measured by the static electricity sensor 514 and the thermal imaging camera 516, respectively, in a captured image generated by the photographing unit 512.

The processor 560 may indicate colors corresponding to a static electricity level measured by the static electricity sensor 514 and a temperature level measured by the thermal imaging camera 516, in a captured image.

Referring to FIGS. 7 and 8, the photographing unit 512 of the device 50 for visualizing a temperature and static electricity may generate a plurality of partially captured images by photographing a plurality of areas of the measurement target T.

Figure 9:
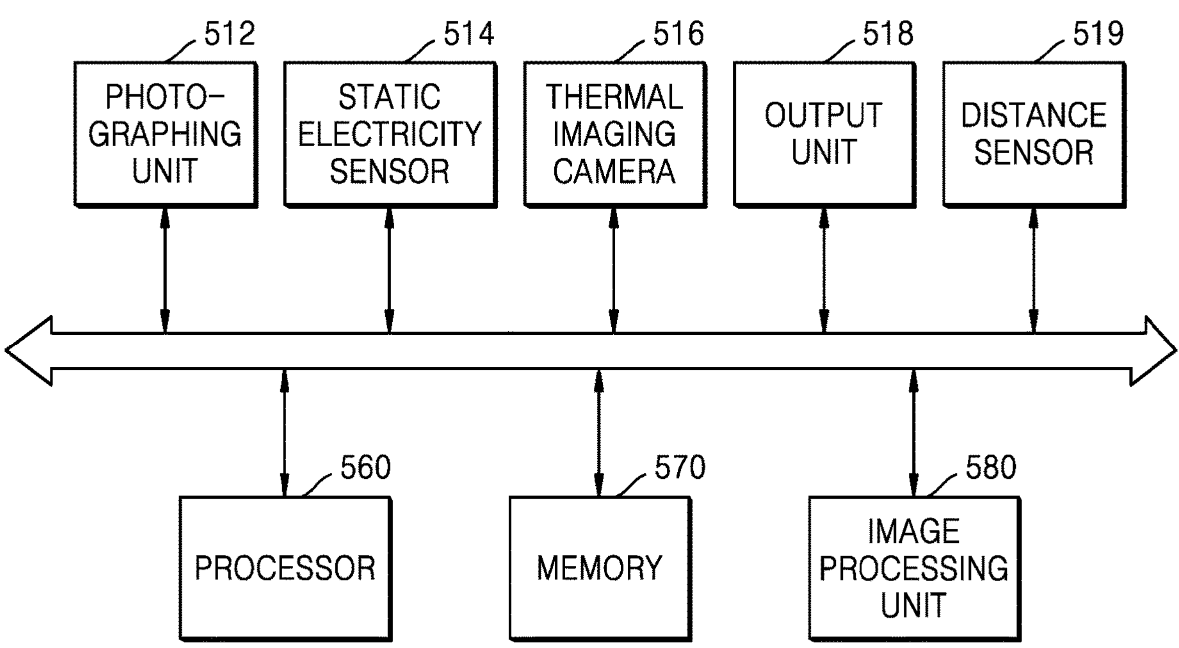
FIG. 9 is a diagram for describing a device for visualizing a temperature and static electricity, according to an embodiment.

FIG. 9 is a diagram for describing a device for visualizing a temperature and static electricity, according to an embodiment. For convenience of description, differences from the descriptions provided above with reference to FIGS. 1 and 2 will be mainly described.

Referring to FIGS. 1 and 9, the device 50 for visualizing a temperature and static electricity may include the photographing unit 512, the static electricity sensor 514, the output unit 518, the distance sensor 519, the processor 560, a memory 570, and an image processing unit 580. The photographing unit 512, the static electricity sensor 514, the output unit 518, the distance sensor 519, and the processor 560 are substantially the same as those described above with reference to FIGS. 1 to 8.

The memory 570 may store a static electricity level measured by the static electricity sensor 514. In addition, the memory 570 may store a color chart to be used by the processor 560. Here, the processor 560 may receive the color chart stored in the memory 570 to determine a color corresponding to a static electricity level measured by the static electricity sensor 514.

The memory 570 may include a volatile memory or a non-volatile memory, according to an embodiment. As the memory 570 stores data used or calculated by the device for visualizing a temperature and static electricity, the data stored in the memory 570 may be provided according to a user's request. Accordingly, the user may effectively control static electricity by using data regarding static electricity levels stored in the memory 570.

The image processing unit 580 may perform preprocessing on a plurality of partially captured images generated by the photographing unit 512 photographing the measurement target T. The image processing unit 580 performs preprocessing such that the processor 560 may generate an entire captured image by combining a plurality of partially captured images, and may facilitate generation of a visualization image. For example, the image processing unit 580 may correct, enhance, or improve optical characteristics of a plurality of captured images generated by the photographing unit 512, by performing correction such as white balance or color adjustment.

FIG. 9 illustrates the processor 560 and the image processing unit 580 as different blocks, but the embodiment is not limited thereto. For example, the processor 560 may include the image processing unit 580.

Figure 10:
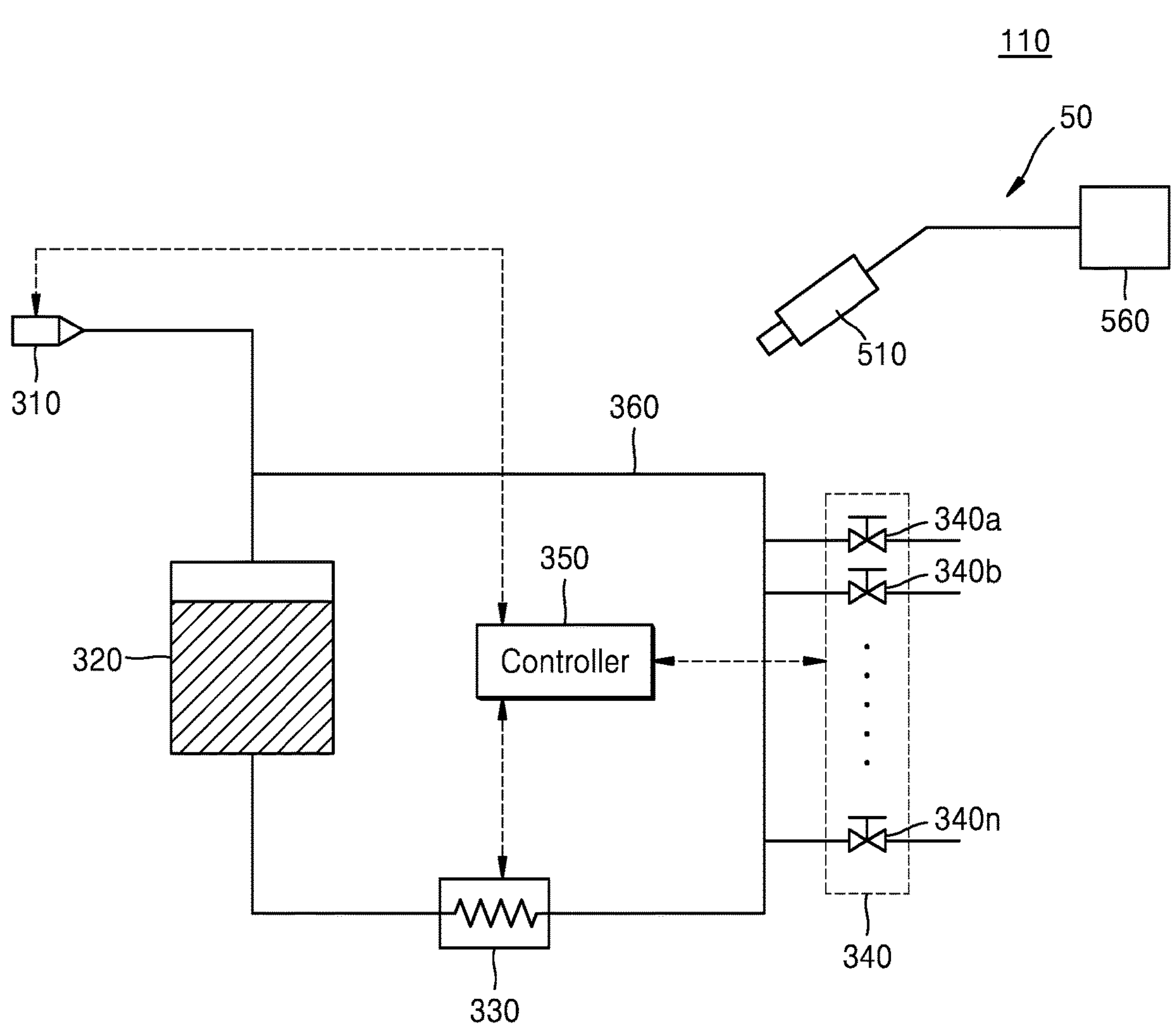
FIG. 10 is a schematic diagram illustrating a substrate processing liquid providing unit including a device for visualizing a temperature and static electricity, according to an embodiment.

FIG. 10 is a schematic diagram illustrating a substrate processing liquid providing unit 110 including the device 50 for visualizing a temperature and static electricity, according to an embodiment.

Referring to FIG. 10, the substrate processing liquid providing unit 110 may include a processing liquid supply module 310, a processing liquid storage module 320, a processing liquid heating module 330, a processing liquid discharge module 340, and a controller 350.

The processing liquid supply module 310 supplies a substrate processing liquid to the processing liquid storage module 320. To this end, the processing liquid supply module 310 may be connected to the processing liquid storage module 320 through a pipe 360 having a certain length. Meanwhile, in order to control the flow of the substrate processing liquid from the processing liquid supply module 310 to the processing liquid storage module 320, at least one valve may be installed on the pipe 360 connecting the processing liquid supply module 310 to the processing liquid storage module 320.

The processing liquid storage module 320 temporarily stores the substrate processing liquid until it is provided to a substrate processing unit 120. The processing liquid storage module 320 may receive and store the substrate processing liquid from the processing liquid supply module 310.

The processing liquid storage module 320 may be supplied with an amount of the substrate processing liquid discharged through the processing liquid discharge module 340 (i.e., an amount of the substrate processing liquid moved to the substrate processing unit 120), from the processing liquid supply module 310. That is, the amount of the substrate processing liquid discharged through the processing liquid discharge module 340 may be equal to the amount of the substrate processing liquid supplied from the processing liquid supply module 310 to the processing liquid storage module 320. The processing liquid heating module 330 heats the substrate processing liquid to increase the temperature of the substrate processing liquid.

When the substrate processing liquid is supplied to the substrate processing unit 120, the processing liquid heating module 330 may heat the substrate processing liquid. To this end, the processing liquid heating module 330 may be installed on the pipe 360 connecting the processing liquid storage module 320 to the processing liquid discharge module 340. The processing liquid heating module 330 may increase the temperature of the substrate processing liquid to a designated temperature (e.g., 70° C. to 80° C.). At this time, the substrate processing liquid may move slowly inside the processing liquid heating module 330 until it reaches the corresponding temperature. In the present embodiment, in order to increase the movement rate of the substrate processing liquid considering of this aspect, a plurality of processing liquid heating modules 330 may be installed on the pipe 360 connecting the processing liquid storage module 320 to the processing liquid discharge module 340.

The plurality of processing liquid heating modules 330 may be arranged in series on the pipe 360 connecting the processing liquid storage module 320 to the processing liquid discharge module 340. However, the present embodiment is not limited thereto. The plurality of processing liquid heating modules 330 may be arranged in parallel on the pipe 360 connecting the processing liquid storage module 320 to the processing liquid discharge module 340. In addition, the plurality of processing liquid heating modules 330 may be arranged in series and parallel on the pipe 360 connecting the processing liquid storage module 320 to the processing liquid discharge module 340.

The processing liquid discharge module 340 may include a plurality of opening/closing valves **340*a*, 340*b*, . . . , 340*n*. The processing liquid discharge module 340 may supply a certain amount of the substrate processing liquid to the substrate processing unit 120 according to the number of opening/closing valves 340***a*, 340*b*, . . . , 340*n*. In addition, the processing liquid discharge module 340 may include a single opening/closing valve.

The controller 350 performs a control function and may control the operation of the processing liquid supply module 310, the processing liquid heating module 330, etc.

In addition, the controller 350 may predict the temperature of the substrate processing liquid stored in the processing liquid storage module 320, based on the amount of the substrate processing liquid supplied from the processing liquid supply module 310 to the processing liquid storage module 320, that is, the inflow amount of the substrate processing liquid. Here, the controller 350 may predict the temperature of the substrate processing liquid stored in the processing liquid storage module 320, by further using the temperature of the substrate processing liquid supplied from the processing liquid supply module 310 to the processing liquid storage module 320. The temperature of the substrate processing liquid supplied from the processing liquid supply module 310 to the processing liquid storage module 320 may be known in advance. When the controller 350 is able to predict the temperature of the substrate processing liquid stored in the processing liquid storage module 320, the surface temperature of the processing liquid heating module 330 may be adjusted based on the prediction, and a time period required for the processing liquid heating module 330 to cause the substrate processing liquid to reach a desired temperature may be reduced. According to an embodiment, the temperature of the pipe 360 through which the processing liquid flows after passing through the processing liquid heating module 330 may increase.

When the inflow amount of the substrate processing liquid is equal to the consumption amount of the substrate processing liquid, the controller 350 may determine the inflow amount of the substrate processing liquid based on the consumption amount of the substrate processing liquid, and may predict the temperature of the substrate processing liquid stored in the processing liquid storage module 320. However, when the inflow amount of the substrate processing liquid is different from the consumption amount of the substrate processing liquid, the controller 350 is unable to identify the inflow amount of the substrate processing liquid, and accordingly, unable to predict the temperature of the substrate processing liquid stored in the processing liquid storage module 320. Thus, accurate measurement of the temperature of the substrate processing liquid stored in the processing liquid storage module 320 is required.

In addition, static electricity may be generated in the processing liquid storage module 320 in which the substrate processing liquid is stored, or in the pipe 360 through which the substrate processing liquid passes, and may act as a critical error in a semiconductor device manufacturing process. However, when two or more measuring devices are required for measuring the temperature and the amount of static electricity of the processing liquid storage module 320 or the pipe 360, issues may arise, such as additional costs or an insufficient space for arrangement of the measuring devices. Therefore, a measuring device including the thermal imaging camera 516 (see FIG. 2) capable of measuring the temperature of a measurement target, and a static electricity sensor (see FIG. 2) capable of measuring the amount of static electricity of the measurement target, and thus capable of simultaneously measuring the temperature and static electricity is required.

Referring to FIG. 2 together, the device 50 for visualizing a temperature and static electricity provided with the thermal imaging camera 516 may measure the temperature of the processing liquid storage module 320, to measure the temperature of the substrate processing liquid stored in the processing liquid storage module 320. To this end, the photographing unit 512 may photograph the exterior of the processing liquid storage module 320.

In addition, the device 50 for visualizing a temperature and static electricity provided with a thermal imaging camera may measure the temperature of the pipe 360 between respective modules to measure the temperature of the substrate processing liquid flowing in the pipe 360. Thus, the photographing unit 512 may photograph the exterior of the pipe 360.

According to an embodiment, the device 50 for visualizing a temperature and static electricity provided with the static electricity sensor 514 may measure the amount of static electricity of the processing liquid storage module 320. To this end, the photographing unit 512 may photograph the exterior of the processing liquid storage module 320.

In addition, the device 50 for visualizing a temperature and static electricity provided with the static electricity sensor 514 may measure the amount of static electricity of the pipe 360 between respective modules. To this end, the photographing unit 512 may photograph the exterior of the pipe 360.

Figure 11:
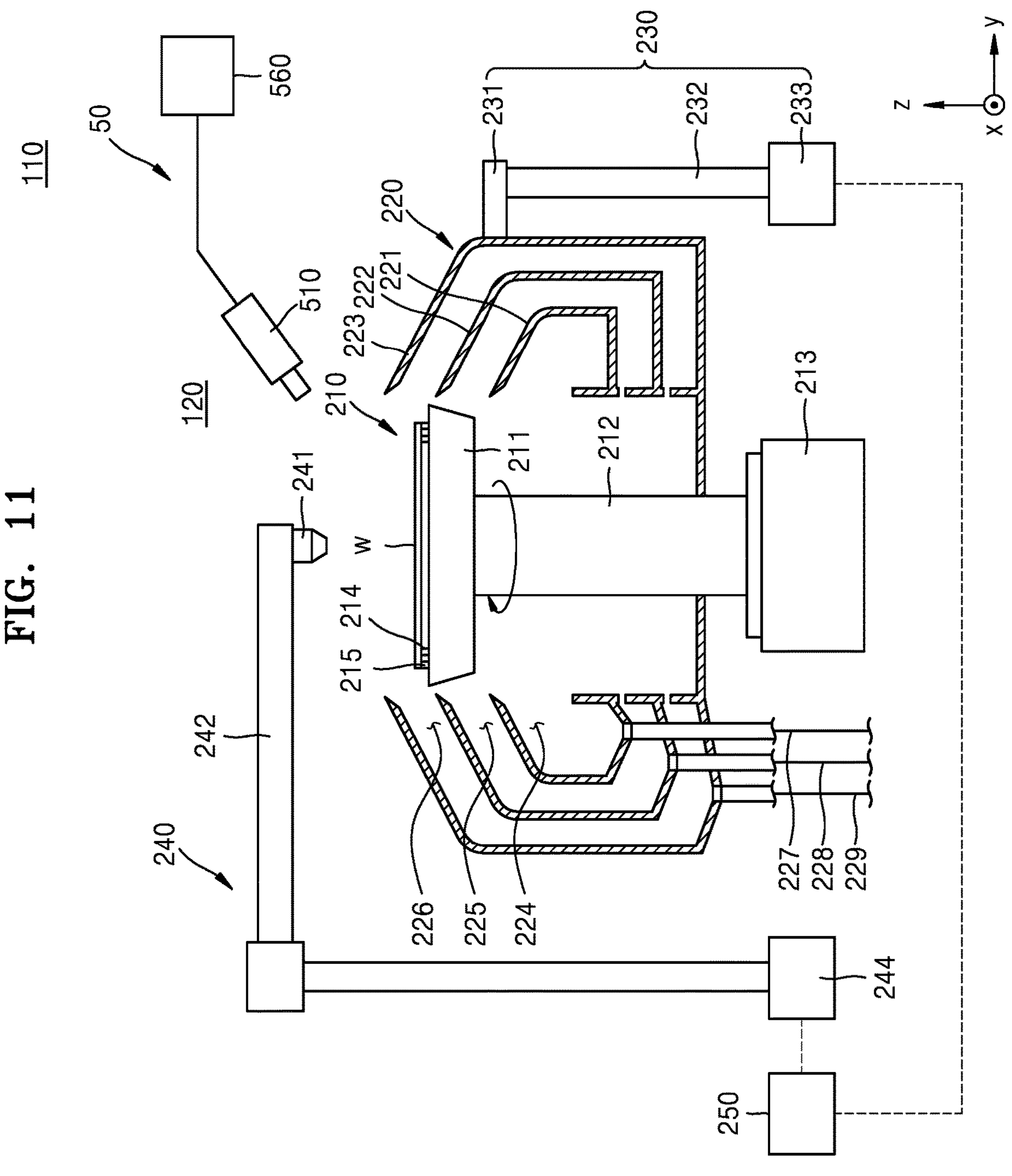
FIG. 11 is a schematic diagram illustrating a substrate processing unit including a device for visualizing a temperature and static electricity, according to an embodiment.

FIG. 11 is a schematic diagram illustrating the substrate processing unit 120 including the device 50 for visualizing a temperature and static electricity, according to an embodiment.

A substrate support module 210 supports a substrate W. When the substrate W is processed, the substrate support module 210 may rotate the substrate W in a direction (a first direction (x direction) or a second direction (y direction)) perpendicular to a third direction (z direction). The substrate support module 210 may be arranged inside a processing liquid recovery module 220 to recover a substrate processing liquid used for processing the substrate W.

The substrate support module 210 may include a spin head 211, a rotation shaft 212, a rotation driving unit 213, a support pin 214, and a guide pin 215. The spin head 211 rotates in the rotation direction (the first direction (x direction) and the second direction (y direction)) of the rotation shaft 212. The spin head 211 may be provided to have the same shape as that of the substrate W.

The rotation shaft 212 is coupled to each of the spin head 211 and the rotation driving unit 213 through both ends thereof. The rotation shaft 212 may rotate about the central axis by a rotational force of the rotation driving unit 213. When the rotational force of the rotation shaft 212 is transmitted to the spin head 211, the spin head 211 may rotate, and accordingly, the substrate W fixed on the spin head 211 may also rotate.

The support pin 214 and guide pin 215 fix the substrate W on the spin head 211. In detail, the support pin 214 supports the bottom surface of the substrate W on the spin head 211, and the guide pin 215 supports a side surface of the substrate W. A plurality of support pins 214 and a plurality of guide pins 215 may be installed on the spin head 211. The support pin 214 may be arranged to have an annular shape as a whole. The support pin 214 may support the bottom surface of the substrate W such that the substrate W may be spaced a certain distance from the top of the spin head 211.

The guide pin 215 is a chucking pin and may support the substrate W such that the substrate W does not deviate from its original position when the spin head 211 rotates. Meanwhile, a back nozzle (not shown) may also be installed at an upper portion of the spin head 211. The back nozzle is for cleaning the bottom surface of the substrate W. The back nozzle may be installed in the upper center of the spin head 211 and may spray the substrate processing liquid to the bottom surface of the substrate W. The processing liquid recovery module 220 recovers the substrate processing liquid used for processing the substrate W. The processing liquid recovery module 220 may be installed to surround the substrate support module 210, and thus provide a space for performing processing on the substrate W.

After the substrate W is seated and fixed on the substrate support module 210 and begins to be rotated by the substrate support module 210, a spray module 240 may spray the substrate processing liquid onto the substrate W under control of a controller module 250. Then, the substrate processing liquid discharged onto the substrate W may be dispersed toward the processing liquid recovery module 220 due to the centrifugal force generated by the rotational force of the substrate support module 210. In this case, when the substrate processing liquid flows into the processing liquid recovery module 220 through an inlet (i.e., a first opening 224 of a first recovery container 221, a second opening 225 of a second recovery container 222, a third opening 226 of a third recovery container 223, etc., which will be described below), the processing liquid recovery module 220 may recover the substrate processing liquid.

In a case where the processing liquid recovery module 220 includes three recovery containers, the processing liquid recovery module 220 may include the first recovery container 221, the second recovery container 222, and the third recovery container 223. The first recovery container 221, the second recovery container 222, and the third recovery container 223 may be implemented as, for example, bowls.

A lifting module 230 linearly moves the processing liquid recovery module 220 in the vertical direction (Z direction). The lifting module 230 may serve to adjust the relative height of the processing liquid recovery module 220 with respect to the substrate support module 210 (or the substrate W). The lifting module 230 may include a bracket 231, a first support shaft 232, and a first driving unit 233.

The spray module 240 supplies the substrate processing liquid onto the substrate W when processing the substrate W. At least one spray module 240 may be installed inside the substrate processing unit 120. In a case where a plurality of spray modules 240 are installed inside the substrate processing unit 120, the spray modules 240 may spray different substrate processing liquids onto the substrate W. The spray module 240 may include a nozzle 241, a nozzle support 242, a second support shaft 243, and a second driving unit 244.

The controller module 250 controls the operation of the lifting module 230 and the spray module 240. In detail, the controller module 250 may control the operation of the first driving unit 233 and the second driving unit 244.

Spraying a substrate processing liquid having a temperature higher than an appropriate temperature onto the substrate W on the substrate support module 210 may have a negative impact on the semiconductor device manufacturing process. In addition, static electricity may be generated in the substrate support module 210 onto which the substrate processing liquid is sprayed, and this may act as a critical error in the semiconductor device manufacturing process. However, when two or more measuring devices are required for measuring the temperature and the amount of static electricity of the substrate support module 210, issues may arise, such as additional costs or an insufficient space for arrangement of the measuring devices. Therefore, a measuring device including the thermal imaging camera 516 capable of measuring the temperature of a measurement target, and the static electricity sensor 514 capable of measuring the amount of static electricity of the measurement target, and thus capable of simultaneously measuring the temperature and static electricity is required.

Referring to FIG. 1 and FIG. 2 together, a device 50 for visualizing a temperature and an amount of static electricity provided with the static electricity sensor 514 and the thermal imaging camera 516 may measure the amount of static electricity and the temperature of the substrate W supported on the substrate support module 210. To this end, the photographing unit 512 may photograph the exterior of the processing liquid storage module 320.

Embodiments have been described herein and illustrated in the drawings. Although the embodiments have been described herein by using specific terms, they are used only for the purpose of explaining the technical spirit of the disclosure and not used to limit the meaning or scope of the claims. Therefore, those of skill in the art will understand that various modifications and other equivalent embodiments may be derived from the embodiments described herein. Therefore, the true technical protection scope of the disclosure should be determined by the appended claims.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the disclosure as defined by the following claims.

What is claimed is:

1. A device for visualizing a temperature and an amount of static electricity comprising:

a photographing unit configured to generate a plurality of partially captured images by photographing a plurality of areas of a measurement target;

a static electricity sensor configured to measure static electricity levels of the plurality of areas of the measurement target;

a thermal imaging camera configured to measure temperatures of the plurality of areas of the measurement target;

a processor configured to generate an entire image by combining the plurality of partially captured images with each other; and an output unit configured to output a visualization image in which temperature levels measured by the thermal imaging camera and the static electricity levels measured by the static electricity sensor are visualized on the entire image, wherein the device is arranged adjacent to a substrate processing liquid providing unit comprising a pipe providing a passage through which a substrate processing liquid is transferred and a processing liquid storage module for storing the substrate processing liquid.

2. The device of claim 1, wherein the visualization image comprises colors respectively corresponding to the temperature levels and the static electricity levels of the measurement target measured by the thermal imaging camera and the static electricity sensor, in the entire image generated by combining the plurality of partially captured images with each other.

3. The device of claim 1, further comprising a distance sensor configured to measure a distance between the measurement target and the static electricity sensor, wherein the static electricity sensor is further configured to, in response to the distance between the measurement target and the static electricity sensor being less than or equal to a threshold value, send data regarding the measured static electricity levels to the processor.

4. The device of claim 3, further comprising an integrated sensor comprising the photographing unit, the static electricity sensor, the thermal imaging camera, the output unit, and the distance sensor, wherein the processor is further configured to control the integrated sensor.

5. The device of claim 1, wherein the measurement target is one among a plurality of measurement targets that comprises an exterior of a substrate seated on a substrate cleaning device, an exterior of the pipe, and an exterior of the processing liquid storage module.

6. The device of claim 1, wherein the processor comprises an image processing unit configured to preprocess the plurality of partially captured images.

7. The device of claim 1, wherein the processor is further configured to generate the entire image by combining the plurality of partially captured images with each other by using a stitching algorithm.

8. The device of claim 1, wherein the processor is further configured to receive the plurality of partially captured images from the photographing unit, receive data regarding the temperature levels measured by the thermal imaging camera and the static electricity levels measured by the static electricity sensor, and generate the visualization image in which colors respectively corresponding to the static electricity levels measured by the static electricity sensor and the temperature levels measured by the thermal imaging camera are indicated in the entire image generated by combining the plurality of partially captured images with each other.

9. The device of claim 8, further comprising a memory for storing color data corresponding to the static electricity levels measured by the static electricity sensor and the temperature levels measured by the thermal imaging camera, wherein the processor is further configured to generate the visualization image by using the color data stored in the memory.

10. The device of claim 1, wherein the output unit is further configured to output the static electricity levels of the measurement target measured by the static electricity sensor and the temperature levels of the measurement target measured by the thermal imaging camera, as numerical values.

11. A device for visualizing a temperature and an amount of static electricity comprising:

a photographing unit configured to generate a plurality of partially captured images by photographing a plurality of areas of a measurement target in a plurality of modes;

a static electricity sensor configured to measure static electricity levels of the plurality of areas of the measurement target;

a thermal imaging camera configured to measure temperature levels of the plurality of areas of the measurement target;

an integrated sensor comprising an output unit configured to output a visualization image in which the static electricity levels measured by the static electricity sensor and the temperature levels measured by the thermal imaging camera are visualized on the plurality of partially captured images; and a processor configured to control the integrated sensor and generate an entire image by combining the plurality of partially captured images with each other, wherein the visualization image comprises colors respectively corresponding the static electricity levels of the measurement target measured by the static electricity sensor and the temperature levels of the measurement target measured by the thermal imaging camera on the entire image, and wherein the device is arranged adjacent to a substrate processing liquid providing unit comprising a pipe providing a passage through which a substrate processing liquid is transferred and a processing liquid storage module for storing the substrate processing liquid.

12. The device of claim 11, wherein the integrated sensor further comprises a distance sensor configured to measure a distance between the measurement target and the static electricity sensor.

13. The device of claim 12, wherein the static electricity sensor is further configured to, in response to the distance between the measurement target and the static electricity sensor measured by the distance sensor being less than or equal to a threshold value, send data regarding the static electricity levels to the processor.

14. The device of claim 11, wherein the processor is further configured to generate the entire image by combining the plurality of partially captured images with each other by using a stitching algorithm.

15. The device of claim 11, wherein the measurement target is an exterior of a substrate seated on a substrate cleaning device, an exterior of the pipe, or an exterior of the processing liquid storage module.

16. The device of claim 11, wherein the processor is further configured to receive the plurality of partially captured images from the photographing unit, receive data regarding the static electricity levels measured by the static electricity sensor and data regarding the temperature levels measured by the thermal imaging camera, generate the visualization image in which colors respectively corresponding to the static electricity levels measured by the static electricity sensor and the temperature levels measured by the thermal imaging camera are indicated on the plurality of partially captured images, and provide the visualization image to the output unit.

17. The device of claim 16, further comprising a memory for storing color data corresponding to the static electricity levels measured by the static electricity sensor and the temperature levels measured by the thermal imaging camera, wherein the processor is further configured to generate the visualization image by using the color data stored in the memory.

18. The device of claim 11, wherein the static electricity sensor is further configured to, when the photographing unit generates the plurality of partially captured images, measure a static electricity level of the measurement target, and the thermal imaging camera is further configured to, when the photographing unit generates the plurality of partially captured images, measure a temperature level of the measurement target.

19. A device for visualizing a temperature and an amount of static electricity comprising:

a photographing unit configured to generate a plurality of partially captured images by photographing a plurality of areas of a measurement target;

a static electricity sensor configured to measure static electricity levels of the plurality of areas of the measurement target;

a thermal imaging camera configured to measure temperatures of the plurality of areas of the measurement target;

a processor configured to generate an entire image by combining the plurality of partially captured images with each other;

an output unit configured to output a visualization image in which temperature levels measured by the thermal imaging camera and the static electricity levels measured by the static electricity sensor are visualized on the entire image;

a distance sensor configured to measure a distance between the measurement target and the static electricity sensor;

an integrated sensor comprising the photographing unit, the static electricity sensor, the thermal imaging camera, the output unit, and the distance sensor; and an image processing unit configured to preprocess the plurality of partially captured images, wherein the visualization image comprises colors respectively corresponding to the temperature levels and the static electricity levels of the measurement target measured by the thermal imaging camera and the static electricity sensor, in the entire image generated by combining the plurality of partially captured images with each other, the static electricity sensor is further configured to, in response to the distance between the measurement target and the static electricity sensor being less than or equal to a threshold value, send data regarding the measured static electricity levels to the processor, the processor is further configured to control the integrated sensor and generate the entire image by combining the plurality of partially captured images with each other by using a stitching algorithm, the measurement target is an exterior of a substrate seated on a substrate cleaning device, an exterior of the pipe, or an exterior of the processing liquid storage module, the device is arranged adjacent to a substrate processing liquid providing unit comprising a pipe providing a passage through which a substrate processing liquid is transferred and a processing liquid storage module for storing the substrate processing liquid.

20. The device of claim 19, further comprising a memory for storing color data corresponding to the static electricity levels measured by the static electricity sensor and the temperature levels measured by the thermal imaging camera, wherein the processor is further configured to generate the visualization image by using the color data stored in the memory, receive the plurality of partially captured images from the photographing unit, receive data regarding the temperature levels measured by the thermal imaging camera and the static electricity levels measured by the static electricity sensor, and generate the visualization image in which colors respectively corresponding to the static electricity levels measured by the static electricity sensor and the temperature levels measured by the thermal imaging camera are indicated in the entire image generated by combining the plurality of partially captured images with each other.

* * * * *